United States Patent [19]

Hiroe et al.

[11] Patent Number: 5,027,382

[45] Date of Patent: Jun. 25, 1991

[54] SHIFT REGISTER CIRCUIT

[75] Inventors: Akihiko Hiroe, Fujisawa; Noriyuki Terao, Sendai, both of Japan

[73] Assignees: Ricoh Company, Ltd., Tokyo; Ricoh Research Institute of General Electronics Co., Ltd., Natori, both of Japan

[21] Appl. No.: 451,176

[22] Filed: Dec. 15, 1989

[30] Foreign Application Priority Data

| Dec. 20, 1988 [JP] | Japan | 63-321718 |
| Dec. 20, 1988 [JP] | Japan | 63-321720 |
| Jun. 16, 1989 [JP] | Japan | 1-154062 |

[51] Int. Cl.⁵ .............................................. G11C 19/28
[52] U.S. Cl. ...................................... 377/76; 377/78; 377/104
[58] Field of Search ...................... 377/75, 76, 77, 78, 377/79, 80, 104, 105, 114

[56] References Cited

U.S. PATENT DOCUMENTS

| 4,387,294 | 6/1983 | Nakamura et al. | 377/78 |
| 4,613,773 | 9/1986 | Koike | 377/105 |
| 4,694,197 | 9/1987 | Sprague | 377/76 |
| 4,951,303 | 8/1990 | Larson | 377/105 |

Primary Examiner—John S. Heyman
Attorney, Agent, or Firm—Oblon, Spivak, McClelland, Maier & Neustadt

[57] ABSTRACT

A shift register circuit comprises a series circuit comprising a plurality of first clocked gate inverters and inverters which are alternately connected in series, where a first one of the first clocked gate inverters is adapted to receive an input pulse signal, an output line connected to an output of each of the inverters for outputting an output pulse signal, and a second clocked gate inverter connected to the output of each of the inverters for outputting an output pulse signal. The first clocked gate inverters operate responsive to a first clock signal, and the second clocked gate inverters operate responsive to a second clock signal which is different from the first clock signal.

12 Claims, 9 Drawing Sheets

FIG. 3 PRIOR ART
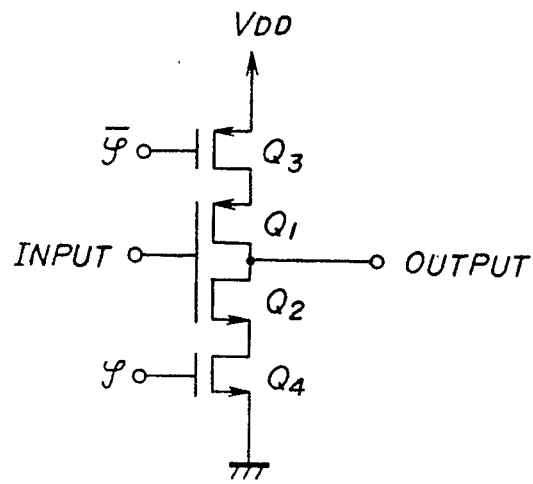
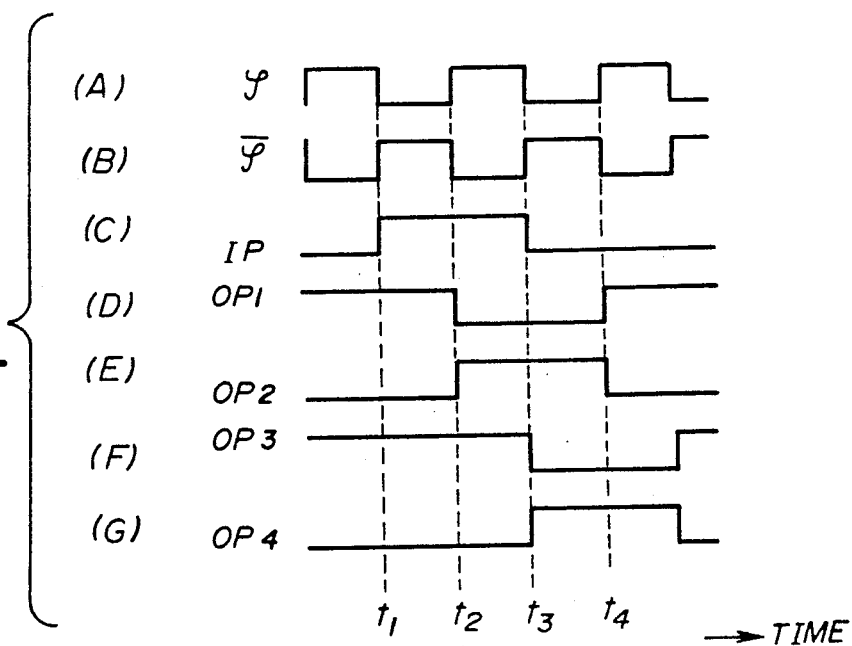
FIG. 4 PRIOR ART

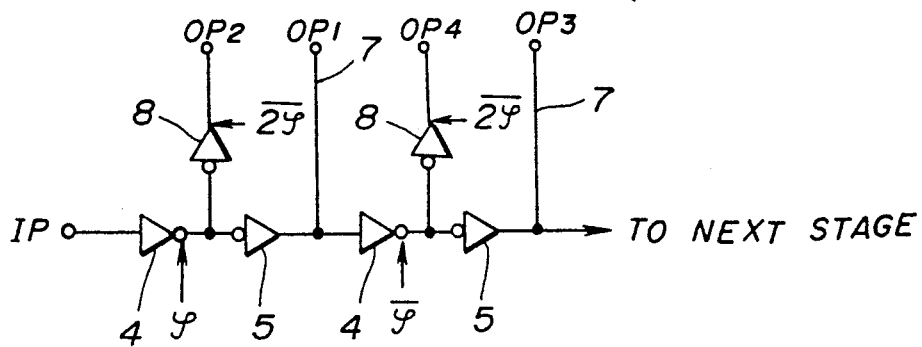
FIG. 8
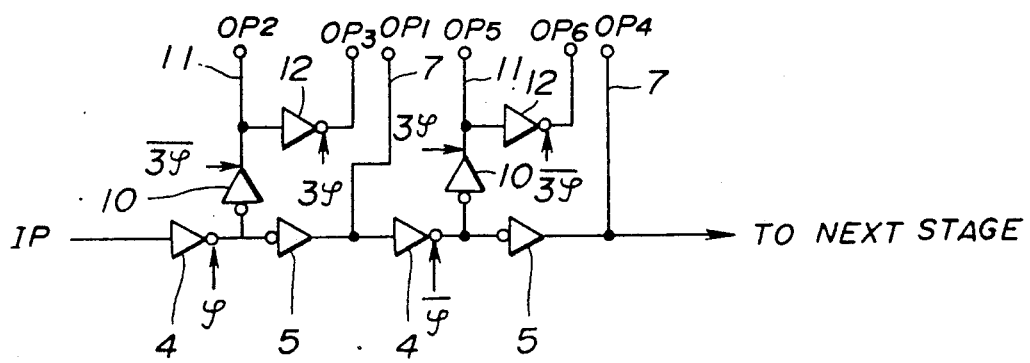
FIG. 9 (A) $\varphi$
(B) $3\varphi$
→ TIME (A) $\varphi_1$
(B) $\varphi_2$
(C) $\varphi_3$

→ TIME

SHIFT REGISTER CIRCUIT

BACKGROUND OF THE INVENTION

The present invention generally relates to shift register circuits, and more particularly to a shift register circuit which uses a clocked inverter and is applicable to a driving circuit of a contact type image sensor and also to shift registers in general.

Recently, helped by the size reduction and improved functions of image input devices, there is active development of full-size contact type image sensors which integrally have driving circuits. In such full-size contact type image sensors, a shift register is used for the driving circuit to control the entire circuit operation responsive to a clock signal.

FIG. 1 shows an example of the shift register. In FIG. 1, a shift register 3 comprises a flip-flop 1 which receives an input pulse signal IP and an inverter 2 which receives the clock signal $\phi$.

FIG. 2A shows another example of the shift register. In FIG. 2A, a static type shift register 6A comprises clocked gate inverters 4 which receive the clock signal $\phi$ or $\bar\phi$ and normal inverters 5 which are alternately connected as shown.

FIG. 2B shows another example of the shift register. In FIG. 2B, a dynamic type shift register 6B comprises clocked gate inverters 4 which receive the clock signal $\phi$ or $\bar\phi$ and normal inverters 5 which are alternately connected as shown.

The clocked gate inverter 4 has a circuit construction shown in FIG. 3. Four transistors Q1 through Q4 are connected in series between a power source $V_{DD}$ and ground. The p-channel transistor Q1 and the n-channel transistor Q2 are provided for receiving an input signal. The p-channel transistor Q3 is provided for receiving the clock signal $\bar\phi$. The n-channel transistor Q4 is provided for receiving the clock signal $\phi$. This circuit construction enables separation of the output signal and the input signal in synchronism with the clock signal $\phi$.

Because the inverted clock signal $\bar\phi$ has a low level when the clock signal $\phi$ has a high level, a low resistance state occurs between the source and drain of the transistors Q3 and Q4. In other words, the transistors Q3 and Q4 turn ON and output voltages thereof change depending on the input voltage. On the other hand, because the inverted clock signal $\bar\phi$ has a high level when the clock signal $\phi$ has a low level, a high resistance state occurs between the source and drain of the transistors Q3 and Q4. In other words, the transistors Q3 and Q4 turn OFF and output voltages thereof become constant even when the input voltage changes assuming that a leak current is within a negligible range. The above description applies to the clocked gate inverter which is synchronized to the clock signal $\phi$, but when the clock signal $\phi$ is applied to the transistor Q3 and the inverted clock signal $\bar\phi$ is applied to the transistor Q4, the circuit becomes a clocked gate inverter which is synchronized to the inverted clock signal $\bar\phi$.

When the shift register employing the flip-flop as shown in FIG. 1 is compared with the shift register employing the clocked gate inverter as shown in FIGS. 2A and 2B, the shift register employing the clocked gate inverter is more advantageous in that the number of required transistors per output is smaller compared to that required in the shift register employing the flip-flop. For this reason, when integrating a circuit which has a large number of bits over a relatively large area as in the case of the full-size contact type image sensor, it is more advantageous to use the shift register shown in FIG. 2A or 2B.

However, according to the conventional shift register employing the clocked gate inverter, the output pulse signal OP is obtained only from the normal inverter 5 as may be see from FIGS. 2A and 2B. Even in the case of the dynamic type shift register shown in FIG. 2B, one clocked gate inverter 4 and one normal inverter 5, that is, a total of two inverters, are required per bit in the shift register portion alone.

In order to drive a full-size image sensor for reading a size A4 paper with 8 bits per 1 mm, it is necessary to use a shift register having a total of 1728 bits. When the dynamic type shift register shown in FIG. 2B is used in this case, a total of approximately 10,000 transistors must be formed without a defect. As a result, the yield per transistor must be in the order of 99.999%. But such a yield of 99.999% per transistor is an extremely high value when considering the yield of a patterning which is carried out to form circuits on a relatively large substrate surface. Therefore, there is a demand to realize a shift register which can operate using a smaller number of transistors.

FIGS. 4(A) through 4(G) show timing charts for explaining the operation timing of the shift registers 6A and 6B shown in FIGS. 2A and 2B. In FIGS. 4(A) through 4(G), it is assumed that the shift registers 6A and 6B respectively have four stages for outputting the output pulse signals OP1 through OP4. As may be seen from FIGS. 4(A) through 4(G), the shift registers 6A and 6B which employ the clocked gate inverter suffer a problem in that there are two timings which could cause an erroneous operation for each output pulse signal OP. In other words, at a time t1, the clocked gate inverter which is synchronized to the clock signal $\phi$ prevents the inversion of the output pulse signal OP when the input pulse signal IP rises with the rising edge of the inverted clock signal $\bar\phi$, and the inversion of the output pulse signal is delayed for ½ the period of the clock signal $\phi$, that is, until a time t2. At a time t3, the falling edge of the clock signal $\phi$0 is used to prevent the inversion of the output pulse signal OP when the input pulse signal IP falls with the rising edge of the inverted clock signal $\bar\phi$. Hence, the pulse width of the output pulse signal OP becomes the same as the pulse width of the input pulse signal IP.

In this case, the transition of the input pulse signal IP and the falling edge of the clock signal $\phi$ which is used for delaying the transfer of the transition to the next stage of the shift register occur simultaneously. For this reason, it is unavoidable that the circuit operation becomes unstable due to a noise, rounding and the like which is generated at the rising and falling edges of these pulse signals. Especially in the case of the driving circuit of the full-size contact type image sensor having a large number of bits, an erroneous operation is easily generated by a distorted (or rounded) clock signal and the in-plane distribution of the transistor characteristics.

SUMMARY OF THE INVENTION

Accordingly, it is a general object of the present invention to provide a novel and useful shift register circuit in which the problems described above are eliminated.

Another and more specific object of the present invention is to provide a shift register circuit comprising a series circuit comprising a plurality of first clocked gate inverters and inverters which are alternately connected in series, a first one of the first clocked gate inverters being adapted to receive an input pulse signal, an output line connected to an output of each of the inverters for outputting an output pulse signal, and a second clocked gate inverter connected to the output of each of the inverters for outputting an output pulse signal. The first clocked gate inverters operate responsive to a first clock signal, and the second clocked gate inverters operate responsive to a second clock signal which is different from the first clock signal. According to the shift register circuit of the present invention, it is possible to greatly reduce the number of inverters required in a shift register portion. For this reason, it is possible to effectively improve the production yield when applied for example to a driving circuit of a full-size contact type image sensor in which a large number of bits must be integrated over a relatively large area. Therefore, the production cost of the circuits using the shift register circuit can be effectively reduced.

Still another object of the present invention is to provide a shift register circuit comprising a series circuit comprising a plurality of first clocked gate inverters and inverters which are alternately connected in series, a first one of the first clocked gate inverters being adapted to receive an input pulse signal, a second clocked gate inverter connected to an output of each of the first clocked gate inverters for outputting an output pulse signal, and an output line connected to an output of each of the inverters for outputting an output pulse signal. The first clocked gate inverters operate responsive to a first clock signal, and the second clocked gate inverters operate responsive to a second clock signal which is different from the first clock signal.

A further object of the present invention is to provide a shift register circuit comprising a series circuit comprising a plurality of first clocked gate inverters and inverters which are alternately connected in series, a first one of the first clocked gate inverters being adapted to receive an input pulse signal, a second clocked gate inverter connected to an output of each of the first clocked gate inverters, and a first output line connected to an output of each of the inverters, and first through nth inverter circuits respectively provided in first through nth levels. The first inverter circuit comprises a third clocked gate inverter and a second output line which are connected to an output of the second clocked gate inverter, an ith inverter circuit comprises a third clocked gate inverter and a second output line which are connected to an output of the third clocked gate inverter which is provided in the (i-1)th level and a third clocked gate inverter and a second output line which are connected to the second output line which is provided in the (i-1)th level, and the third clocked gate inverters and the second output lines which are provided in the nth level output output pulse signals. The first clocked gate inverters operate responsive to a first clock signal, and the second clocked gate inverters operate responsive to a second clock signal which is different from the first clock signal. The third clocked gate inverters respectively operate responsive to third clock signals which are dependent on the level in which the third clocked gate inverters are provided and different from the first and second clock signals.

Another object of the present invention is to provide a shift register circuit comprising a series circuit comprising n clocked gate inverters which are connected in series, where n is an even number, a first one of the clocked gate inverters being adapted to receive an input pulse signal, an inverter connected to an output of every other ones of the n clocked gate inverters for outputting an output pulse signal, and an output line connected to an output of each of remaining ones of the n clocked gate inverters for outputting an output pulse signal. The clocked gate inverters operate responsive to clock signals which have identical frequencies and pulse widths but mutually different phases. According to the shift register circuit of the present invention, it is possible to guarantee a stable circuit operation because there is a margin for the timings of the input and output pulse signals.

Other objects and further features of the present invention will be apparent from the following detailed description when read in conjunction with the accompanying drawings.

BRIEF DESCRIPTION OF THE DRAWINGS

FIG. 3 is a circuit diagram showing a clocked gate inverter;

FIGS. 4(A) through 4(G) are timing charts for explaining the problems of the shift registers shown in FIGS. 2A and 2B;

FIG. 7 is a circuit diagram showing a second embodiment of the shift register circuit according to the present invention;

FIG. 8 is a circuit diagram showing a third embodiment of the shift register circuit according to the present invention;

FIGS. 9(A) and 9(B) are timing charts for explaining an operation of the third embodiment;

DESCRIPTION OF THE PREFERRED EMBODIMENTS

Figure 1:
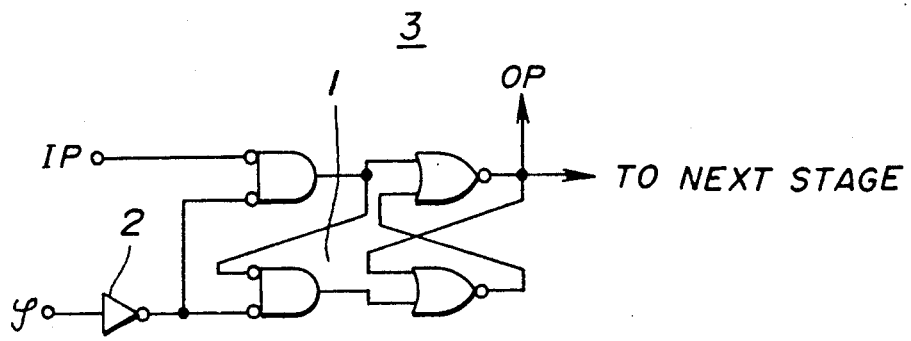
FIG. 1 is a circuit diagram showing an example of a conventional shift register.
Figure 2A:
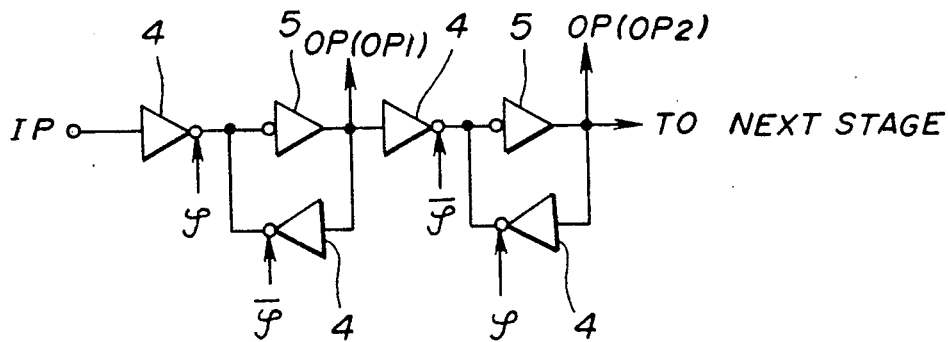
FIGS. 2A and 2B respectively are circuit diagrams showing other examples of the conventional shift register.
Figure 2B:
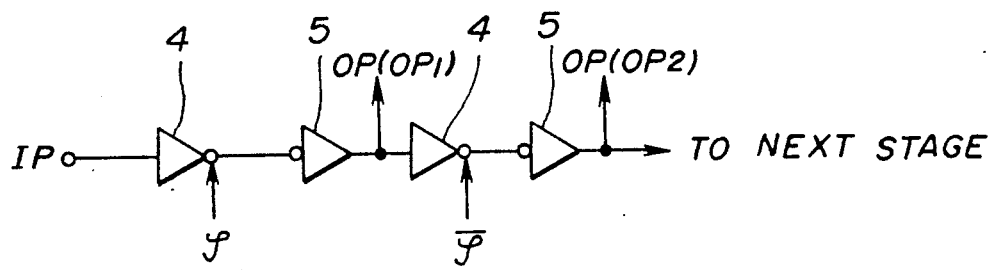
Figure 5:
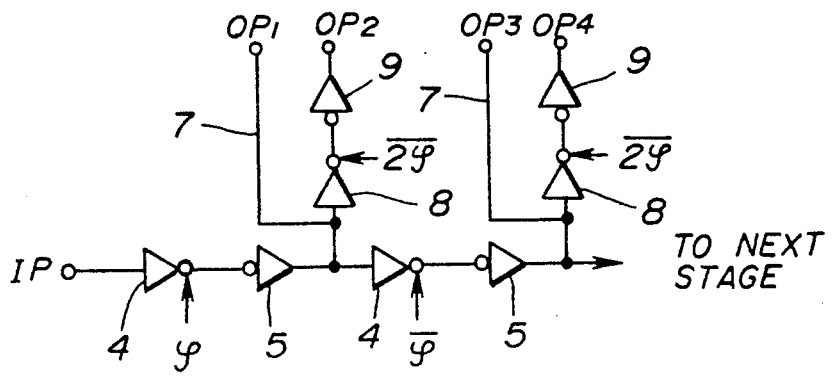
FIG. 5 is a circuit diagram showing a first embodiment of a shift register circuit according to the present invention.

FIG. 5 shows a first embodiment of a shift register circuit according to the present invention. In FIG. 5, those parts which are essentially the same as those corresponding parts in FIG. 2B are designated by the same reference numerals, and a description thereof will be omitted. An output line 7 for outputting an output pulse signal OP1 (or OP3) and a clocked gate inverter 8 are connected to an output of the normal inverter 5. The clocked gate inverter 8 and a normal inverter 9 are connected in series and output an output pulse signal OP2 (or OP4).

When the clock signal $\phi$ or $\bar{\phi}$ for operating the clocked gate inverter 4 is taken as a reference clock signal, a clock signal for operating the clocked gate inverter 8 is set different from the reference clock signal. In this embodiment, a clock signal $2\phi$ having a frequency which is twice the frequency of the reference clock signal is used to operate the clocked gate inverter 8. By connecting the clocked gate inverters 8 which operate responsive to the clock signal $2\phi$, the output pulse signals OP1, OP3, . . . are obtained from the output lines 7 while the output pulse signals OP2, OP4, . . . are obtained from the clocked gate inverters 8 through the normal inverters 9.

Figure 6:
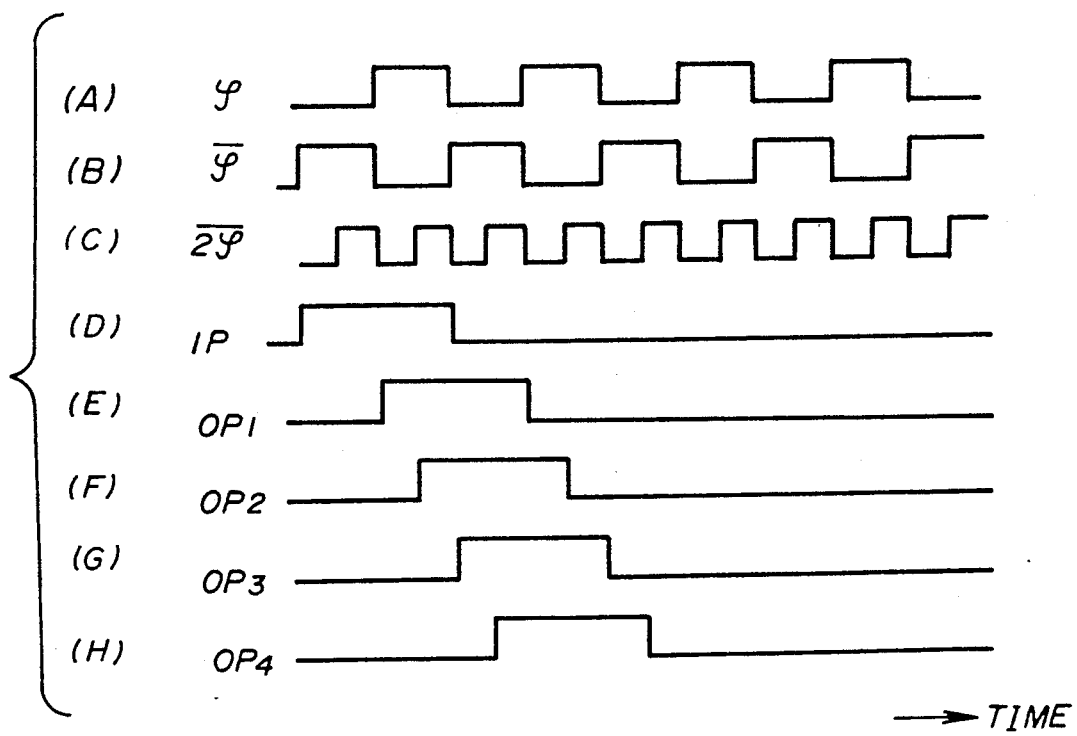
FIGS. 6(A) through 6(H) are timing charts for explaining an operation of the first embodiment.

FIGS. 6(A) and 6(B) respectively show the clock signals $\phi$ and $\bar{\phi}$, that is, the reference clock signals. FIG. 6(C) shows the clock signal $2\phi$. When the input pulse signal IP shown in FIG. 6(D) is applied to the clocked gate inverter 4 in the first stage, the output pulse signals OP1 through OP4 shown in FIGS. 6(E) through 6(H) are output from the corresponding one of the output lines 7 and the normal inverters 9. The output pulse signals OP1 through OP4 are successively shifted with respect to each other by $\frac{1}{4}$ the period of the reference clock signal $\phi$ or $\bar{\phi}$. Basically, corresponding output pulse signals can be obtained if two of the conventional shift register shown in FIG. 2B are provided and operated at twice the frequency with a shifted timing.

According to this embodiment, the number of inverters required in the shift register portion is reduced to $\frac{1}{2}$ that required in the conventional shift register shown in FIG. 2B.

Next, a description will be given of a second embodiment of the shift register circuit according to the present invention, by referring to FIG. 7. In FIG. 7, those parts which are essentially the same as those corresponding parts in FIG. 5 are designated by the same reference numerals, and a description thereof will be omitted. The output line 7 for outputting the output pulse signal OP1 (or OP3) is connected to the output of the normal inverter 5. On the other hand, the clocked gate inverter 8 which operates in response to the clock signal $2\phi$ and outputs the output pulse signal OP2 (or OP4) is connected to an output of the clocked gate inverter 4. The normal inverters 9 of the first embodiment can be omitted in this second embodiment.

According to this embodiment, the number of clocked gate inverters required can be reduced by one for every two outputs when compared with the conventional shift register shown in FIG. 2B.

Next, a description will be given of a third embodiment of the shift register circuit according to the present invention, by referring to FIG. 8. In FIG. 8, those parts which are essentially the same as those corresponding parts in FIG. 5 are designated by the same reference numerals, and a description thereof will be omitted. In this embodiment, clocked gate inverters 10 which operate responsive to a clock signal $3\phi$ is used in place of the clocked gate inverter 7, and clocked gate inverters 12 which operate responsive to a clock signal $3\bar{\phi}$ are additionally provided. The clock signals $3\phi$ and $3\bar{\phi}$ respectively have a frequency which is three times the frequency of the reference clock signal. FIG. 9(A) shows the reference clock signal $\phi$ and FIG. 9(B) shows the clock signal $3\phi$. An output line 11 is connected to an output of the clocked gate inverter 10 and outputs the output pulse signal OP2 (or OP4). The clocked gate inverter 12 is connected to the output of the clocked gate inverter 10 and outputs the output pulse signal OP3 (or OP6).

As may be readily understood from the first through third embodiments, the shift register circuit according to the present invention may be constructed using clocked gate inverters which operate in response to a clock signal which has a frequency n times the frequency of the reference clock signal, where n is an arbitrary integer.

It is also possible to use clocked gate inverters which operate responsive to a clock signal which has a pulse width different from the pulse width of the reference clock signal. In addition, it is possible to use clocked gate inverters which operate responsive to a clock signal which has a pulse width and a frequency different from those of the reference clock signal.

Next, descriptions will be given of embodiments in which there are provided clocked gate inverters which operate responsive to clock signals which have frequencies $2^n$ times the frequency of the reference clock signal.

Figure 10:
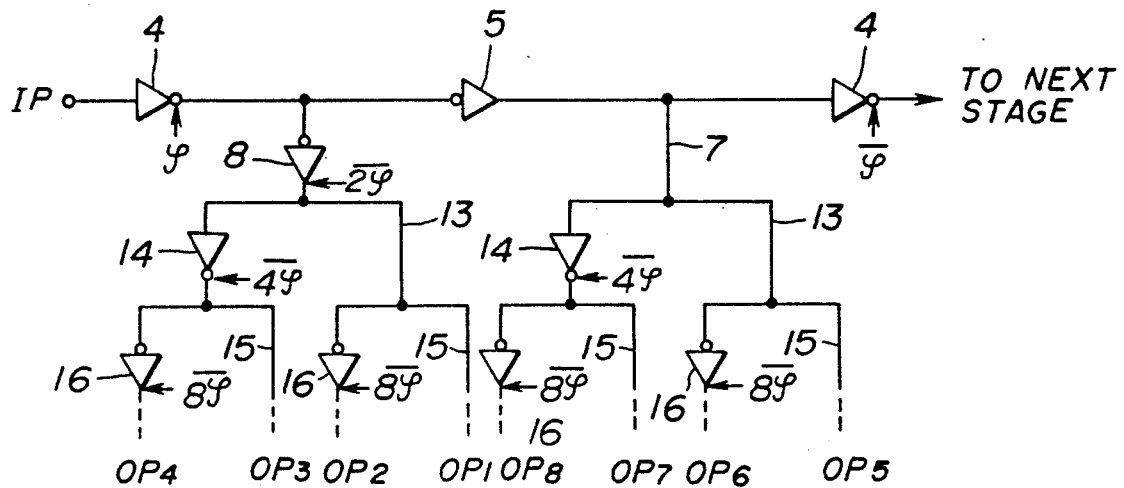
FIG. 10 is a circuit diagram showing a fourth embodiment of the shift register circuit according to the present invention.

FIG. 10 shows a fourth embodiment of the shift register circuit according to the present invention. In FIG. 10, those parts which are essentially the same as those corresponding parts in FIG. 5 are designated by the same reference numerals, and a description thereof will be omitted. In this embodiment, the output of the normal inverter 5 is connected to the output line 7, and the clocked gate inverter 8 which operates responsive to the clock signal $2\phi$ is connected to the output of the clocked gate inverter 4. In addition, an output line 13 and a clocked gate inverter 14 which operates responsive to a clock signal $4\phi$ which has a frequency four times that of the reference clock signal $\phi$ are connected to the output line 7. Another output line 13 and another clocked gate inverter 14 are connected to the output of the clocked gate inverter 8. Furthermore, an output line 15 and a clocked gate inverter 16 which operates responsive to a clock signal $8\phi$ which has a frequency eight times that of the reference clock signal $\phi$ are connected to the output line 13. Another output line 15 and another clocked gate inverter 16 are connected to the output of the clocked gate inverter 14.

According to this embodiment, the number of branches successively increases with each level of a tree structure, and three levels of the tree structure is shown in FIG. 10. The circuit constituting the shift register portion can be simplified considerably in this embodiment, although the number of kinds of clock signals used increases when compared to the previously described embodiments. In addition, a branch circuit part comprising a clocked gate inverter which operates responsive to a clock signal which has a frequency of two times or more the frequency of the reference clock signal may be regarded as a circuit which outputs a signal which has a timing slightly shifted from that of the input pulse signal IP similarly to a shift register. Compared to the second embodiment shown in FIG. 7, it is possible to further reduce the number of transistors which are required because the total number of output pulse signals to be obtained is equal to the number of clocked gate inverters minus one.

Figure 11:
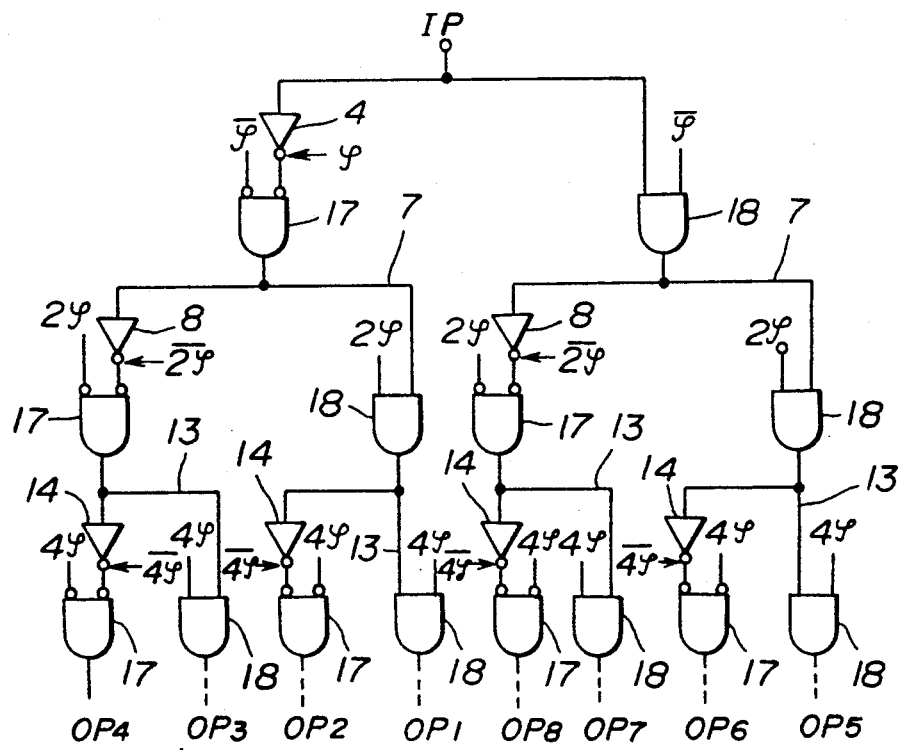
FIG. 11 is a circuit diagram showing a fifth embodiment of the shift register circuit according to the present invention.

FIG. 11 shows a fifth embodiment of the shift register circuit according to the present invention. In FIG. 11, those parts which are essentially the same as those corresponding parts in FIG. 5 are designated by the same reference numerals, and a description thereof will be omitted. In the fourth embodiment, the output pulse signals which are obtained partially overlap each other. In this embodiment, this overlap of the output pulse signals is eliminated by using a combination of a NAND gate 17 and an AND gate 18 which are connected as shown in FIG. 11.

If some overlap of the output pulse signals may exist, it is possible to omit some of the AND gates 18. In this case, the frequency of the clock signal which is used to obtain a logical product may be set to a frequency which is lower than that shown.

Figure 12:
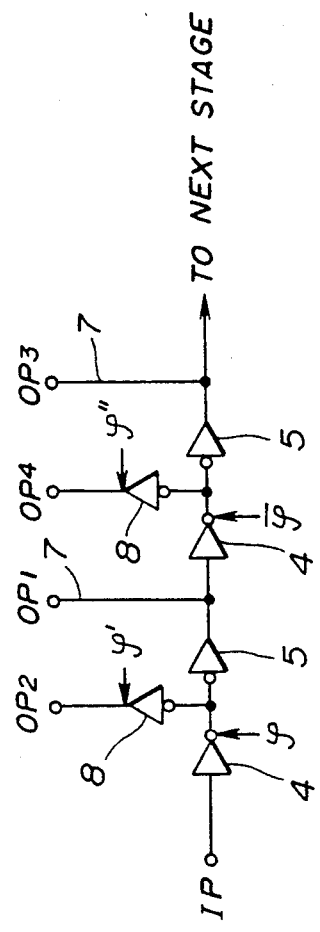
FIG. 12 is a circuit diagram showing a sixth embodiment of the shift register circuit according to the present invention.
Figure 13:
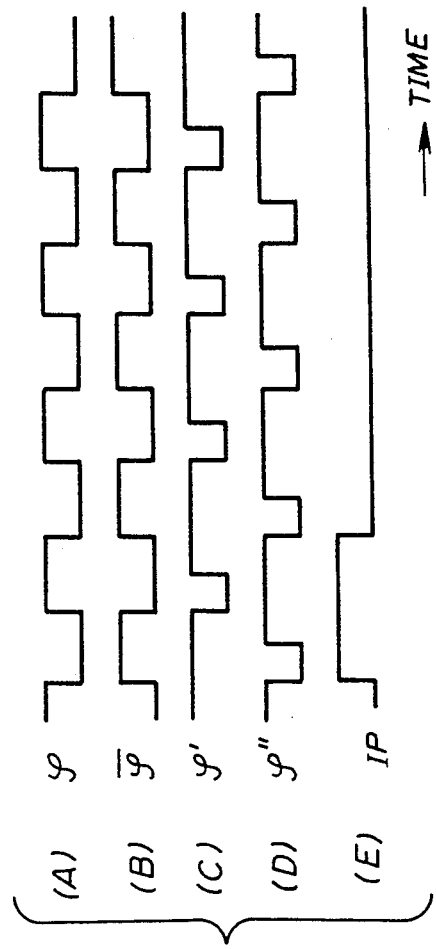
FIGS. 13(A) through 13(E) are timing charts for explaining an operation of the sixth embodiment.

Next, a description will be given of a sixth embodiment of the shift register circuit according to the present invention, by referring to FIG. 12. In FIG. 12, those parts which are essentially the same as those corresponding parts in FIG. 7 are designated by the same reference numerals, and a description thereof will be omitted. In this embodiment, the clocked gate inverters 8 are operated responsive to clock signals having pulse widths different from that of the reference clock signal. In FIG. 12, one clocked gate inverter 8 is operated responsive to a clock signal $\phi'$ shown in FIG. 13(C) and another clocked gate inverter 8 is operated responsive to a clock signal $\phi''$ shown in FIG. 13(D). The pulse widths and the rising edges of these clock signals $\phi'$ and $\phi'$ differ from those of the reference clock signal as may be seen from FIGS. 13(A) and 13(B) which respectively show the reference clock signals $\phi$ and $\phi$. FIG. 13(E) shows the input pulse signal IP.

This embodiment which uses clock signals having pulse widths different from that of the reference clock signal is not only applicable to the second embodiment shown in FIG. 7 but is also similarly applicable to the other embodiments described above.

Figure 14:
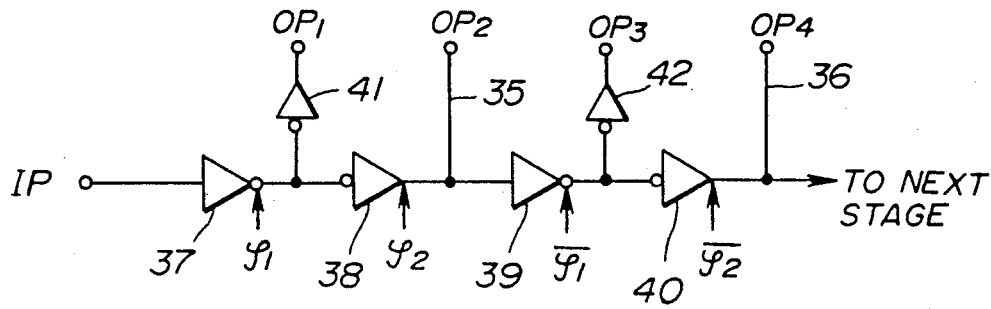
FIG. 14 is a circuit diagram showing a seventh embodiment of the shift register circuit according to the present invention.
Figure 15:
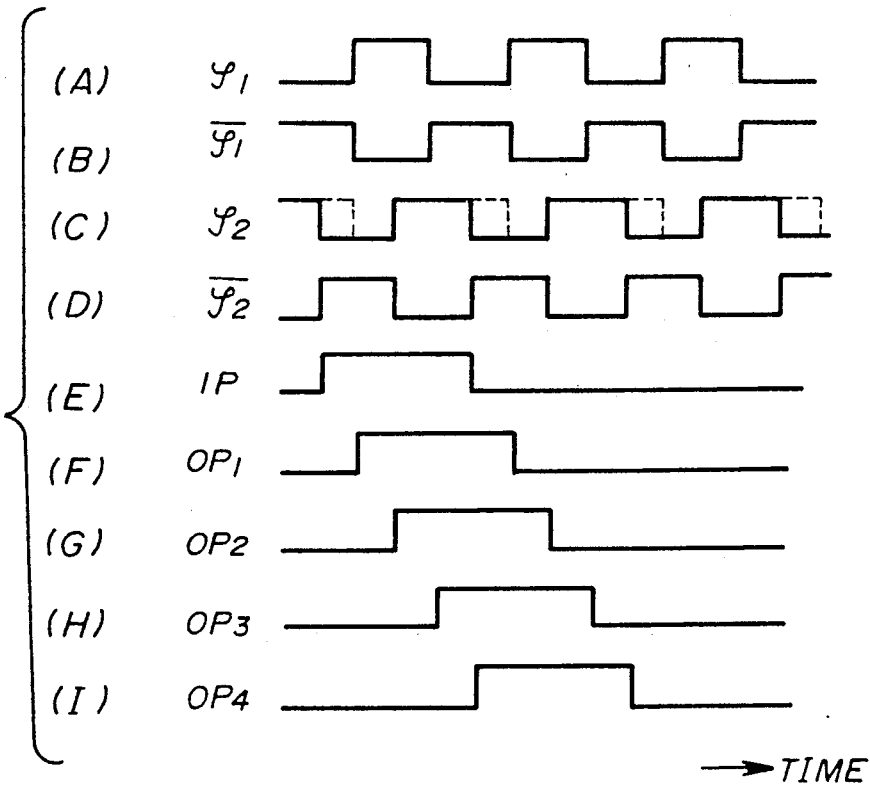
FIGS. 15(A) through 15(I) are timing charts for explaining an operation of the seventh embodiment.

Next, a description will be given of a seventh embodiment of the shift register circuit according to the present invention, by referring to FIG. 14. In FIG. 14, clocked gate inverters 37, 38, 39 and 40 which respectively operate responsive to clock signals $\phi1$, $\phi2$, $\phi1$ and $\phi2$ are connected in are respectively shown in FIGS. 15(A), 15(C), 15(B) and 15(D). A normal inverter 41 is connected to an output of the clocked gate inverter 37 and outputs the output pulse signal OP1 shown in FIG. 15(F). FIG. 15(E) shows the input pulse signal IP. An output line 35 is connected to an output of the clocked gate inverter 38 and outputs the output pulse signal OP2 shown in FIG. 15(G). A normal inverter 42 is connected to an output of the clocked gate inverter 39 and outputs the output pulse signal OP3 shown in FIG. 15(H). In addition, an output line 36 is connected to an output of the clocked gate inverter 40 and outputs the output pulse signal OP4 shown in FIG. 15(I).

The clock signals $\phi1$, $\phi1$, $\phi2$ and $\phi2$ respectively shown in FIGS. 15(A) through 15(D) have the same frequency but having timings such that the rising edges differ from each other.

According to this embodiment, one output pulse signal OP is obtained from each clocked gate inverter. In other words, one inverter is used to output one output pulse signal OP in the shift register portion, and with respect to the same number of output bits the number of transistors which are required can be reduced considerably when compared to the conventional shift registers shown in FIGS. 2A and 2B. In addition, because the rising edges of the clock signals $\phi1$, $\phi1$, $\phi2$ and $\phi2$ occur at mutually different timings, the problem described before with reference to FIGS. 4(A) through 4(G) will not occur and a stable circuit operation is guaranteed.

The pulse widths of the clock signals $\phi1$, $\phi1$, $\phi2$ and $\phi2$ are not limited to those shown shown in FIGS. 15(A) through 15(D). For example, the clock signal $\phi2$ may having falling edges which occur with a timing indicated by a phantom line in FIG. 15(C) although the timing requirement becomes more strict in this case. From a different point of view, it can be regarded that the phantom line indicates a margin in which the timing of the falling edges of the clock signal $\phi2$ may vary. The falling edges of the other clock signals $\phi1$, $\phi1$ and $\phi2$ may also occur with timings which are shifted similarly to the clock signal $\phi2$.

Figure 16:
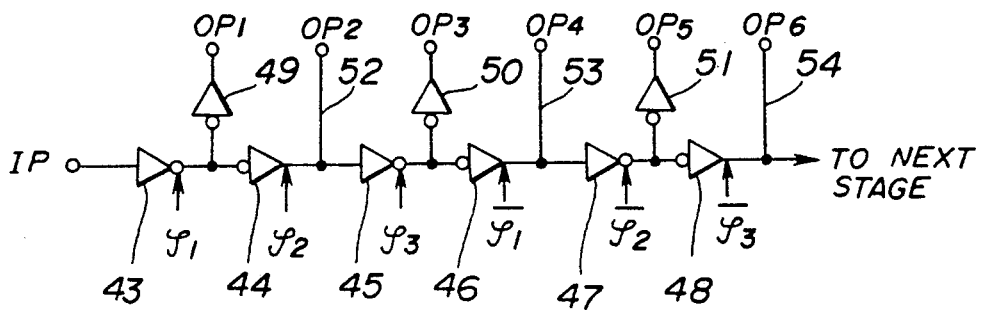
FIG. 16 is a circuit diagram showing an eighth embodiment of the shift register circuit according to the present invention.
Figure 17:
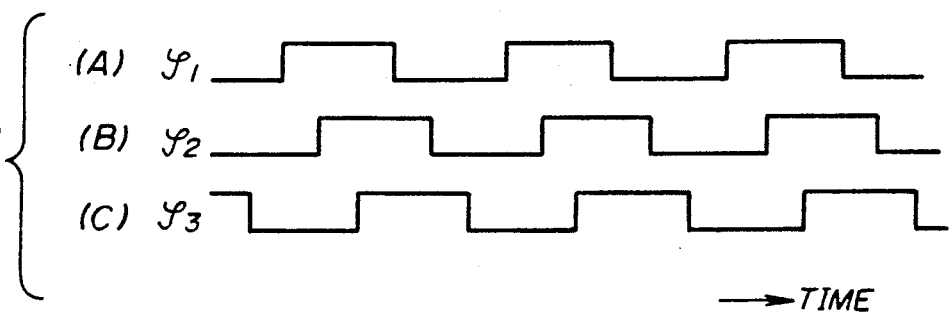
FIGS. 17(A) through 17(C) are timing charts for explaining an operation of the eighth embodiment.

Next, a description will be given of an eighth embodiment of the shift register circuit according to the present invention, by referring to FIG. 16. In FIG. 16, clocked gate inverters 43, 44, 45, 46, 47 and 48 which respectively operate responsive to clock signals $\phi1$, $\phi2$, $\phi3$, $\phi1$, $\phi2$ and $\phi3$ are connected in series. The clock signals $\phi1$, $\phi2$ and $\phi3$ are respectively shown in FIGS. 17(A), 17(B) and 17(C). The clock signals $\phi1$, $\phi2$ and $\phi3$ respectively are inverted signals of the clock signals $\phi1$, $\phi2$ and $\phi3$.

A normal inverter 49 is connected to an output of the clocked gate inverter 43 and outputs the output pulse signal OP1. An output line 52 is connected to an output of the clocked gate inverter 44 and outputs the output pulse signal OP2. A normal inverter 50 is connected to an output of the clocked gate inverter 45 and outputs the output pulse signal OP3. An output line 53 is connected to an output of the clocked gate inverter 46 and outputs the output pulse signal OP4. A normal inverter 51 is connected to an output of the clocked gate inverter 47 and outputs the output pulse signal OP5. An output line 54 is connected to an output of the clocked gate inverter 48 and outputs the output pulse signal OP6.

The clock signals $\phi1$, $\phi2$ and $\phi3$ have the same frequency but the rising edges thereof occur with mutually different timings. Similarly, the clock signals $\phi1$, $\phi2$ and $\phi3$ have the same frequency but the rising edges thereof occur with mutually different timings.

In this embodiment, the output pulse signals OP1 through OP6 are successively shifted by 1/6 the period of the clock signals $\phi1$, $\phi2$ and $\phi3$ (or $\phi1$, $\phi2$ and $\phi3$). It may seem as though no advantageous results would be obtained by increasing the number of clock signals. But in actual practice, it becomes possible to output a large number output pulse signals per unit time assuming that the operation frequencies of the clocked gate inverters are constant.

Similarly to the seventh and eighth embodiments, it is possible to use eight clock signals which have eight different phases such that the rising edges are successively shifted by $\frac{1}{8}$ the period of the clock signals. It is thus possible to use ten or more clock signals which have ten or more different phases such that the rising edges are successively shifted by 1/10 or less times the period of the clock signals.

Next, a description will be given of a ninth embodiment of the shift register circuit according to the present invention, by referring to FIG. 18. In the seventh and eighth embodiments, the clock signals which are used have rising edges which are shifted by 1/m times the period of the clock signals, where m is an even number. According to the ninth embodiment, the clock signals which are used have rising edges which are shifted by 1/p times the period of the clock signals, where p is an odd number. For the sake of convenience, p=3 in FIG. 18.

Figure 18:
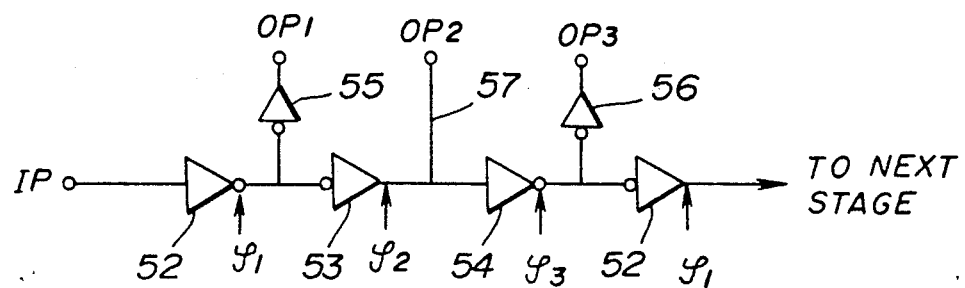
FIG. 18 is a circuit diagram showing a ninth embodiment of the shift register circuit according to the present invention.

In FIG. 18, clocked gate inverters 52, 53, 54 and 52 which respectively operate responsive to clock signals $\phi 1$, $\phi 2$, $\phi 3$ and $\phi 1$ are connected in series. The clock signals $\phi 1$, $\phi 2$ and $\phi 3$ are respectively shown in FIGS. 19(A), 19(B) and 19(C). A normal inverter 55 is connected to an output of the clocked gate inverter 52 and outputs the output pulse signal OP1. An output line 57 is connected to an output of the clocked gate inverter 53 and outputs the output pulse signal OP2. A normal inverter 56 is connected to an output of the clocked gate inverter 54 and outputs the output pulse signal OP3.

Figure 19:
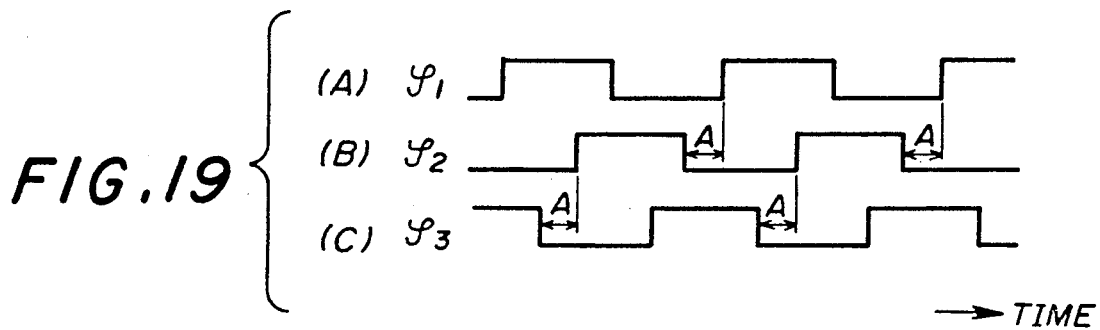
FIGS. 19(A) through 19(C) are timing charts for explaining an operation of the ninth embodiment.

As shown in FIGS. 19(A) through 19(C), the clock signals $\phi 1$, $\phi 2$ and $\phi 3$ have the same frequency but have rising edges which occur with mutually different timings.

In FIGS. 19(B) and 19(C), a portion A corresponds to a margin with respect to the rounding of the clock signals and the like. Compared to the case where four clock signals having four mutually different phases are used, it may be seen that the margin A with respect to the period of the clock signals is reduced.

In FIG. 18, it appears as if only three kinds of clock signals are required. But in actual practice, two kinds of clock signals are required to operate each clocked gate inverter, and a total of six kinds of clock signals are required. On the other hand, the overlap of the output pulse signals OP is reduced compared to the seventh embodiment shown in FIG. 14 where only four kinds of clock signals are required.

The shift register circuit can be modified similarly for the case where p=5, 7, . . .

The first through ninth embodiments described above are based on the dynamic type shift register shown in FIG. 2B. However, it is of course possible to similarly base each of the first through ninth embodiments on the static type shift register shown in FIG. 2A. For example, in order to stably operate the shift register circuit in the low frequency range, a clocked gate inverter can be added in each feedback path to realize a static type shift register circuit.

Further, the present invention is not limited to these embodiments, but various variations and modifications may be made without departing from the scope of the present invention.

What is claimed is:

1. A shift register circuit comprising:
a series circuit comprising a plurality of first clocked gate inverters and inverters which are alternately connected in series, a first one of said first clocked gate inverters being adapted to receive an input pulse signal;
an output line connected to an output of each of said inverters for outputting an output pulse signal; and
a second clocked gate inverter connected to the output of each of said inverters for outputting an output pulse signal,
said first clocked gate inverters operating responsive to a first clock signal,
said second clocked gate inverters operating responsive to a second clock signal which is a mutually different frequency from said first clock signal.

2. The shift register circuit as claimed in claim 1 wherein said second clock signal has a frequency n times that of said first clock signal, where n is an arbitrary integer.

3. A shift register circuit comprising:
a series circuit comprising a plurality of first clocked gate inverters and inverters which are alternately connected in series, a first one of said first clocked gate inverters being adapted to receive an input pulse signal;
a second clocked gate inverter connected to an output of each of said first clocked gate inverters for outputting an output pulse signal; and
an output line connected to an output of each of said inverters for outputting an output pulse signal,
said first clocked gate inverters operating responsive to a first clock signal,
said second clocked gate inverters operating responsive to a second clock signal which is a mutually different frequency from said first clock signal.

4. The shift register circuit as claimed in claim 3 wherein said second clock signal has a frequency n times that of said first clock signal, where n is an arbitrary integer.

5. The shift register circuit as claimed in claim 3 which further comprises a third clocked gate inverter which is connected to an output of each of said second clocked gate inverters for outputting an output pulse signal, said third clocked gate inverter operating responsive to a third clock signal which is different from said first and second clock signals.

6. A shift register circuit comprising:
a series circuit comprising a plurality of first clocked gate inverters and inverters which are alternately connected in series, a first one of said first clocked gate inverters being adapted to receive an input pulse signal;
a second clocked gate inverter connected to an output of each of said first clocked gate inverters; and
a first output line connected to an output of each of said inverters; and
first through nth inverter circuits respectively provided in first through nth levels, said first inverter circuit comprising a third clocked gate inverter and a second output line which are connected to an output of said second clocked gate inverter, an ith inverter circuit comprising a third clocked gate inverter and a second output line which are connected to an output of the third clocked gate inverter which is provided in the (i-1)th level and a third clocked gate inverter and a second output line which are connected to the second output line which is provided in the (i-1)th level, said third clocked gate inverters and said second output lines which are provided in the nth level outputting output pulse signals;
said first clocked gate inverters operating responsive to a first clock signal, said second clocked gate inverters operating responsive to a second clock signal which is different from said first clock signal, said third clocked gate inverters respectively operating responsive to third clock signals which are dependent on the level in which the third clocked gate inverters are provided and different from said first and second clock signals.

7. The shift register circuit as claimed in claim 6 wherein said first, second and third clock signals have mutually different frequencies, and said third clock signals have frequencies which are different for each level of said inverter circuits.

8. The shift register circuit as claimed in claim 7 wherein said second clock signal has a frequency n times that of said first clock signal, and said third clock signal has a frequency m times that of said first clock signal, where n and m are arbitrary integers.

9. The shift register circuit as claimed in claim 6 wherein said first, second and third clock signals have the same frequency but mutually different pulse widths, and said third clock signals have pulse widths which are different for each level of said inverter circuits.

10. The shift register circuit as claimed in claim 6 which further comprises a 2-input gate which is connected to an output of each of said first through third clocked gate inverters, and said 2-input gate receives a clock signal identical to that received by the clocked gate inverter from which said 2-input gate also receives a signal.

11. A shift register circuit comprising:
a series circuit comprising a plurality of first clocked gate inverters and inverters which are alternatively connected in series, a first one of said first clocked inverters being adapted to receive an input pulse signal;
a second clocked gate inverter connected to an output of each of said first clocked gate inverters for outputting an output pulse signal;
a third clocked gate inverter which is connected to an output of each of said second clocked gate inverters for outputting an output pulse signal;
an output line connected to an output of each of the said inverters for outputting an output pulse signal; and
wherein said first clocked gate inverters operate in response to a first clocked signal,
said second clocked gate inverters operate in response to a second clocked signal which is different from said first clocked signal, and
said third clock gate inverter operate in response to a third clocked signal which is different from said first and second clocked signals.

12. The shift register circuit as claimed in claim 11 wherein said second and third clock signals have frequencies which are integral multiples of a frequency of said first clock signal.

* * * * *